US005637441A

United States Patent [19]

[11] Patent Number: 5,637,441

[45] Date of Patent: Jun. 10, 1997

Brenk et al.

[54] HYDROPHILIZED BASE MATERIAL AND RECORDING MATERIAL PRODUCED THEREFROM

[75] Inventors: Michael Brenk, Wiesbaden; Mathias Eichhorn, Niedernhausen; Andreas Elsaesser, Idstein, all of Germany

[73] Assignee: AGFA-Gevaert AG, Leverkusen, Germany

[21] Appl. No.: 492,148

[22] Filed: Jun. 19, 1995

[30] Foreign Application Priority Data

Jul. 1, 1994 [DE] Germany .......................... 44 23 140,7

[51] Int. Cl.[6] .............................. G03F 7/09; G03F 7/016; G03F 7/023; B32B 15/08

[52] U.S. Cl. ....................... 430/278.1; 430/160; 430/161; 430/166; 428/461; 427/327; 427/421; 427/435

[58] Field of Search ................................ 430/278.1, 157, 430/161, 166, 160; 428/461; 427/327, 421, 435

[56] References Cited

U.S. PATENT DOCUMENTS

| | | | |
|---|---|---|---|
| 3,232,783 | 2/1966 | Deal et al. | 117/62.2 |
| 3,276,868 | 10/1966 | Uhlig | 96/1.5 |
| 3,396,019 | 8/1968 | Uhlig et al. | 430/161 |
| 3,468,725 | 9/1969 | Uhlig et al. | 430/161 |
| 3,549,365 | 12/1970 | Thomas | 430/161 |
| 4,153,461 | 5/1979 | Berghaeuser et al. | 96/75 |
| 4,376,814 | 3/1983 | Walls | 430/161 |
| 4,427,765 | 1/1984 | Mohr et al. | 430/525 |
| 5,049,479 | 9/1991 | Zertani et al. | 430/271 |
| 5,217,813 | 6/1993 | Roser et al. | 428/461 |
| 5,272,035 | 12/1993 | Sekiya | 430/157 |
| 5,300,397 | 4/1994 | Aoshima | 430/157 |

FOREIGN PATENT DOCUMENTS

| | | |
|---|---|---|
| 0 190 643 | 8/1986 | European Pat. Off. . |
| 0 474 010 | 3/1992 | European Pat. Off. . |
| 0 490 231 | 6/1992 | European Pat. Off. . |
| 918 599 | 2/1963 | United Kingdom . |
| 918 735 | 2/1963 | United Kingdom . |

*Primary Examiner*—John S. Chu
*Attorney, Agent, or Firm*—Foley & Lardner

[57] ABSTRACT

A mechanically and/or electrochemically grained and optionally anodized base material composed of aluminum or its alloys, to which a hydrophilic layer of at least one polymer containing basic and acidic groups is applied. This layer is followed by a further hydrophilic layer which contains at least one compound containing at least one phosphono group. In addition, the invention relates to a method of producing said carrier material and to photosensitive recording material for offset printing plates produced therewith.

26 Claims, No Drawings

HYDROPHILIZED BASE MATERIAL AND RECORDING MATERIAL PRODUCED THEREFROM

BACKGROUND OF THE INVENTION

1. Field of the Invention

The present invention relates to a mechanically and/or electrochemically grained and optionally anodized base material composed of aluminum or its alloys. The base material includes a hydrophilic layer composed of at least one polymer containing basic and acidic groups. The base material can be used as a radiation-sensitive recording material having the base and a radiation-sensitive layer, from which offset printing plates can be produced.

2. Description of Related Art

Base materials known in the art for offset printing plates are provided with a photosensitive layer (copying layer), with whose aid a printing image is generated photomechanically. After the production of the printing image, the base layer carries the printing image areas and at the same time forms the hydrophilic image background, for the lithographic printing process, at the image-free areas-(non-image areas).

Suitable base materials for such base layers are metals such as aluminum, steel, copper, brass or zinc. Plastic sheets or paper are also suitable. In the printing-plate field, aluminum and its alloys have gained acceptance as substrates for base layers. The surface of the aluminum or aluminum alloy is grained mechanically, chemically and/or electrochemically by known methods and optionally anodized. Such pretreatments are however, not sufficient for base layers, which must meet the following requirements:

- After the exposure, relatively soluble parts of the photosensitive layer must be removable from the base easily and without residue during the development in order to generate the hydrophilic non-image areas. Any residues of the layer still adhering to the base are recognizable as color haze since photosensitive layers are generally intensively colored. The consequence thereof is that the printing plate may "scum" at these points.
- After the exposure and development, portions of the non-image areas of the printing plates frequently still have to be corrected, with undesirable image components being stripped. The non-image areas laid bare in this process should not differ in color and lightness from the non-image areas laid bare by the developer. The uniform lightness is necessary in order to be able to use measuring instruments with which the proportion of the area of the image regions is determined by means of the lightness difference between image regions and non-image regions.
- The undesirable lightness difference between a non-image area produced by correction and one produced during the normal development process is designated as correction contrast.
- The base laid bare in the non-image areas must be sufficiently hydrophilic in order to take up water rapidly and permanently during the litho-graphic printing process. Water is what repels the greasy printing ink.
- The photosensitive layer must not peel from the base material before the exposure, and the printing part of the layer must not peel from it after the exposure.

Normally, the base material is additionally hydrophilized because it does not otherwise absorb sufficient water. The hydrophilizing agent must be matched to the particular photosensitive layer in order to avoid undesirable reactions and impairment of adhesion.

The known hydrophilizing methods are (regardless of the photosensitive layer, the developer solution or the correcting fluids) subject to more or less considerable disadvantages. For example, after the treatment with hydrophilizing alkali-metal silicates, which result in a good developability and hydrophilicity, an impairment of the photosensitive layers has to be accepted after prolonged storage time.

If the base materials are hydrophilized with water-soluble polymers, their good solubility (particularly in aqueous alkali developers such as those predominantly used for the development of positive-working layers) results in a marked reduction in the hydrophilizing action. In the case of polymers containing sulfonic acid groups, the interaction of the free anionic acid functional groups with the diazo cations of negative-working photosensitive layers manifests itself adversely. The result is that, after development, a marked color haze due to retained diazo compounds is recognizable on the non-image areas. Polymeric acrylic acid derivatives are disadvantageous because, in an application form in which they are able to prevent color haze, i.e., in a solution of 0.1 to 10 g/l, they are very viscous and an excess can only be removed from the surface of the base with considerable efforts. Particularly susceptible to color haze formation are highly photosensitive layers which are used for imprinting with lasers (EP-A 0 364 735) and which contain a polymeric binder, a free-radical-polymerizable compound containing at least one polymerizable group and a photoreducable dye, a radiation-cleavable trihalomethyl compound and a metallocene compound as photoinitiators. Particularly high requirements are therefore imposed on the hydrophilic base material so that no constituents of the photosensitive layer remain behind on the non-image areas.

From DE-C 11 34 093 (equivalent to U.S. Pat. No. 3,276,868) and U.S. Pat. No. 4,153,461, it is known to hydrophilize the base material with phosphonic acids, in particular with polyvinylphosphonic acid or copolymers of vinylphosphonic acid with acrylic acid and vinyl acetate. It is also mentioned that salts of the phosphonic acids are suitable. This is not, however, specified in greater detail.

EP-A 0 069 320 (equivalent to U.S. Pat. No. 4,427,765) discloses a method of hydrophilizing an aluminum base material for planographic printing plates in which salts of polyvinylphosphonic acids, polyvinyl- sulfonic acids, polyvinylmethylphosphinic acids and other polyvinyl compounds containing at least divalent metal cations are used.

According to EP-A 0 190 643, the base material is coated with a homopolymer of acrylamidoisobutylene-phosphonic acid or a copolymer of acrylamidoisobutylene-phosphonic acid and acrylamide or with a salt of said homopolymer or copolymer containing an at least divalent metal cation. The coating has the advantage that the finished printing plates exhibit a good hydrophilicity at the non-image points and have a reduced color haze.

EP-A 0 490 231 describes the treatment of printing-plate bases with polyethylenimines which contain structural elements of the type $—(CH_2—CH_2—N(X)—)_n—$ or with polyvinylamines which contain structural elements of the type $—(CH_2—CH(NY^1Y^2)—)^n—$, X, $Y^1$ and $Y^2$ being optionally C-substituted sulfomethyl groups or phosphonomethyl groups. However, satisfactory results are still not achieved with this method.

SUMMARY OF THE INVENTION

One object of the present invention is to produce base materials useful for example, for offset printing plates which have very good hydrophilizing properties, are equally suitable for all photosensitive layers without the photosensitive layer being impaired by reaction with the hydrophilizing agent on prolonged storage, and have a very good adhesion to the printing areas of the layer.

Another object of the invention is to provide a process for the production of the base material. Still another object of the invention is to provide a recording material which is produced from the base material of the present invention.

In accomplishing the foregoing objects, there has been provided according to one aspect of the present invention, a base material which comprises: (a) a substrate comprising aluminum or an aluminum alloy, with the substrate being grained by at least one of mechanical and electrochemical graining and optionally anodized; (b) a first hydrophilic layer adjacent to the substrate, with the first hydrophilic layer comprising at least one polymer containing basic and acidic groups; and (c) a further hydrophilic layer comprising at least one compound which contains at least one phosphono group. In a preferred embodiment, the basic groups in the polymer containing basic and acidic groups comprise one or more of primary, secondary and tertiary amino groups, and the acidic groups comprise one or more of carboxy, phosphono or sulfo groups.

According to another aspect of the present invention, there has been provided according to another aspect of the present invention, a method of producing the base material of the present invention. The process includes the steps of: (a) applying the first hydrophilic layer to the grained and optionally anodized base material; (b) applying the further hydrophilic layer on top of said first hydrophilic layer.

Further objects, features and advantages of the present invention will become apparent from the detailed description of preferred embodiments which follows.

DETAILED DESCRIPTION OF THE PREFERRED EMBODIMENT

The present invention comprises a mechanically and/or electrochemically grained and optionally anodized base material composed of aluminum or its alloys. The base material has first a hydrophilic layer composed of at least one polymer containing basic and acidic groups, wherein the first layer is followed by a further hydrophilic layer which contains at least one compound containing at least one phosphono group.

The polymer of the first hydrophilic layer may be one which contains basic and acidic groups. The basic and acidic groups may be any desired group. The basic groups in the polymer of the first hydrophilic layer are preferably primary, secondary or tertiary amino groups and the acid groups are preferably carboxy, phosphono or sulfo groups. The secondary and tertiary amino groups may at the same time also be a constituent of the polymer main chain. Particularly preferred for the first hydrophilic layer are the sulfomethylated or phosphonomethylated polyethylenimines and polyvinylamines described in EP-A 0 490 231 which is hereby incorporated by reference. These polymers may additionally contain units of other monomers, for example, units of substituted aminoacrylates, vinylpyrrolidones or vinylimidazoles. Particularly preferred are also polymers containing units of dialkylaminoalkyl (meth) acrylate and (meth) acrylic acid. Of these polymers, a terpolymer containing units of dimethylaminomethyl methacrylate, ethyl acrylate and methacrylic acid has proved particularly satisfactory.

The polymers of the first layer are generally neither strongly acid nor strongly alkaline. Their pH is in the range from 4 to 9, preferably 4.5 to 7.5.

The compounds used for the further hydrophilic layer and containing at least one phosphono group are, on the other hand, generally markedly acidic. In aqueous solution they generally have a pH of less than 4, preferably 1 to 3. Any compounds having at least one phosphono group are useful. Preferably, these compounds are also polymeric. The polyvinylphosphonic acid described in U.S. Pat. No. 4,153,461, which is hereby incorporated by reference particularly suitable.

The sequence of hydrophilizing layers is, surprisingly, of material importance for the quality of the product. There is no proven or known explanation for this, but hypothetical ideas exist. It is presumed that the layer composed of at least one polymer containing acidic and basic groups creates adsorption locations at which the compound containing at least one phosphono group then accumulates to a greater extent than would be the case without this activation. That is plausible inasmuch as it can be shown by different surface-sensitive methods, such as energy-dispersive X-ray technique (EDX), Auger electron spectroscopy, electron spectroscopy for chemical analysis (ESCA) and secondary ion mass spectroscopy (SIMS), that only with this sequence of layers is a particularly large amount of active substances taken up on the surface of the base. At the same time, the hydrophilic layer may be continuous or discontinuous. However, the hypothetical explanation is not intended to limit the scope of the present invention.

In another aspect of the present invention, a method of producing the base materials is also disclosed. The two hydrophilizing layers may be applied by spraying-on the appropriate solutions or by immersion in such solutions. However, any coating method capable of applying the hydrophilizing layers can be used. The concentration of the hydrophilizing compounds in said solutions may, at the same time, vary within wide limits. However, solutions having a concentration of 0.1 to 50 g/l, preferably 0.3 to 5 g/l, in each case have proved particularly advantageous.

After the application of the first hydrophilic layer, the material may be rinsed off to remove the excess hydrophilizing agent. Drying between the two stages is not necessary, but also does not do any harm. The coating can preferably be carried out at temperatures of 20° to 95° C., but temperatures of 30° to 65° C. are more preferred. The material to be coated is generally sprayed for 1 s to 5 min or immersed in each case. It is generally disadvantageous if the treatment time is shorter than 1 s, but not if it is more than 5 min.

The second hydrophilic layer is generally applied in the same way as the first. The spraying and immersing solutions used for this purpose have approximately the same concentration.

After the two treatment steps, the coated base is preferably dried at temperatures from, for example, 100° to 130° C. However, other temperatures suitable for drying can be used.

The determination of the weight of the applied hydrophilic coating presents problems since even small amounts of the product exhibit a marked hydrophilizing effect. In addition, the hydrophilizing agents adhere relatively strongly to the surface of the base material. Thus, the effective amount can vary. However, the amount applied is in any case generally below 0.5 mg/dm$^2$, in particular below 0.25 mg/dm$^2$. The minimum amount is about 0.02 mg/dm$^2$. The specifications of amounts apply to each of the two steps individually.

The modified polyethylenimine and the modified polyvinylamine, and also methods for their preparation are described in EP-A 0 490 231 which is expressly incorporated by reference in its entirety. They are generally prepared from polyethylenimines and polyvinyl-amines by phosphonomethylation and/or sulfomethylation.

After application of the hydrophilizing layers, the base materials according to the invention can then be coated with various photosensitive mixtures. Basically, all those mixtures are suitable which result in layers which, after imagewise exposure, subsequent development and/or fixing, result in a positive or negative image. The material suitable as printing plate retains its excellent hydrophilicity at the non-image areas and exhibits virtually no color haze any longer.

Another aspect of the present invention also provides a recording material having a base composed of aluminum or its alloys and a radiation-sensitive layer, wherein the base is hydrophilized as described above.

The following examples below are intended to explain the invention without limiting it in any way. In these examples, the following grained and anodized printing-plate bases are used:

Type 1

0.3 mm thick bright-rolled aluminum (DIN material No. 3.0255) was degreased with a 2%-strength aqueous NaOH pickling solution at a temperature of 50° to 70° C. The surface was then electrochemically grained with alternating current in an $HNO_3$-containing electrolyte. The $R_z$ value of the surface roughness was then 6 μm. The subsequent anodization was carried out in an electrolyte containing sulfuric acid. The oxide layer weight was about 3.0 $g/m_2$.

Type 2

0.3 mm thick bright-rolled aluminum (DIN material No. 3.0515) was degreased with a 2%-strength aqueous NaOH pickling solution at a temperature of 50° to 70° C. The surface was electrochemically grained with alternating current in an electrolyte containing hydrochloric acid. The $R_z$ value of the surface roughness was then 6 μm. The subsequent anodization was carried out in an electrolyte containing sulfuric acid. The oxide layer weight was about 2.0 $g/m^2$.

Type 3

0.2 mm thick bright-rolled aluminum (DIN material No. 3.0255) was degreased in a 2%-strength aqueous NaOH pickling solution at a temperature of 50° to 70° C. and then mechanically grained with particulate cutting agents (for example, quartz powder or aluminum oxide). The $R_z$ value of the surface roughness was then 4 μm. The subsequent anodization was carried out in an electrolyte containing phosphoric acid. The oxide layer weight was about 0.9 $g/m^2$.

Type 4

This base corresponds to that of type 2, with the sole difference that it was anodized up to an oxide layer weight of 1.5 $g/m^2$.

The following examples show the advantages of the base material according to the invention. The hydrophilizations A* to D* shown in Table 1 were used for the comparison experiments, while the base material according to the invention was hydrophilized according to E.

TABLE 1

| | Hydrophilization |
|---|---|
| A* | none |
| B* | with polyvinylphosphonic acid (2 g/l at 75° C., pH 2) |
| C* | with N-phosphonomethylpolyethylenimine (1 g/l at 65° C., pH 4.5) |
| D* | first B), then C) |
| E | first C), then B) |

EXAMPLE 1

A base of type 2 was hydrophilized in accordance with each of A* to E of Table 1 and provided with a positive-working diazo layer composed of 5.00% by weight of cresol-xylenol-formaldehyde novolak resin having a hydroxyl number of 420 in accordance with DIN 53 783/53 240 and a weight-average molecular weight according to GPC of 6,000 (polystyrene standard), 1.20% by weight of ester obtained from 1.5 mol of (1,2-naphthoquinone2-diazide)-5-sulfonyl chloride and 1 mol of 2,3,4-trihydroxybenzophenone, 0.15% by weight of (1,2-naphthoquinone 2-diazide)-4-sulfonyl chloride, 0.05% by weight of Victoria pure blue (C.I. 44045) and to make 100% a solvent mixture composed of methyl ethyl ketone and propylene glycol monomethyl ether (40/60).

The coated base was dried for 1 min at 125° C. The film weight was 2.4 $g/m^2$. A matting solution (a 20%-strength aqueous solution of a terpolymer of vinylsulfonic acid, ethyl acrylate and styrene) was then sprayed electrostatically onto the radiation-sensitive layer in such a way that the mean height of the elevations was 4 μm.

The plates were contacted with a test montage in a vacuum contact copying frame by evacuation, exposed using a 5 kW metal-halide-doped mercury-vapor lamp at a distance of 110 cm in such a way that an open step 4 in the UGRA offset test wedge resulted after development, which corresponds to a high exposure for the purpose of film edge elimination.

Development was carried out at 20° C. in a development apparatus (Hoechst AG VA86) using a potassium silicate developer (total alkali-metal content 0.5 mol/l, $K_2O$:$SiO_2$ ratio =1:1.2, later designated as "developer type 1") at a processing speed of 1.4 m/min.

The occurrence of residual layer hazes after the developer had been loaded with 4 $m^2$ of recording material (image component 25%) per liter of developer was investigated. The results are shown in Table 2.

EXAMPLE 2

A base of type 1 was hydrophilized in accordance with Table 1 and provided with a reversible positive layer composed of 4.80% by weight of cresol-xylenol-formaldehyde novolak resin having a hydroxyl number of 420 in accordance with DIN 53 783/53 240 and a weight-average molecular weight according to GPC of 6,000 (polystyrene standard), 1.05% by weight of ester obtained from 3.4 mol of (1,2-naphthoquinone2-diazide)-4-sulfonyl chloride and 1 mol of 2,3,4,2',3',4'-hexa-hydroxy-5,5-dibenzoyldiphenylmethane, 0.05% by weight of 2-(4-styrylphenyl-4,6-bistrichloromethyl-s-triazine, 0.10% by weight of crystal violet (C.I. 42555), 1.00% by weight of silica filler having a mean particle size of 3.9 μm, 0.10% by weight of surfactant based on dimethyl-siloxane units and ethylene oxide units, and to make 100% by weight a solvent mixture composed of tetrahydrofuran and propylene glycol monomethyl ether (55/45).

The coated base was dried for 1 min at 125° C. The film weight was 1.8 g/$m^2$. Further processing was then carried out as follows:

1. exposure in a copying frame as in Example 1 through a test master, 60 s,
2. annealing at 135° C. in a continuous furnace, 60 s,
3. cooling with circulating air, 10 s,
4. burn-out without master using UV-A fluorescent lamps having a radiation power of 240 watts, 30 s in a continuous apparatus, and
5. development in an apparatus as in Example 1 at a processing speed of 1.2 m/min.

Development was carried out with a sodium silicate developer in accordance with DE-A 40 27 299 expressly incorporated by reference in its entirety having a total alkali-metal content of 0.8 mol/l ($Na_2O$:$SiO_2$=1:1) and a O,O'-biscarboxymethylpolyethyleneglycol-1000 content of 0.6% by weight (designated below as "developer type 2").

The occurrence of residual layer hazes after a loading of the developer with 2 $m^2$ of recording material (image component 25%) per liter of developer was investigated. The results are shown in Table 2.

EXAMPLE 3

A printing-plate base of type 4 was subjected to the four different aftertreatments mentioned in Table 1 and provided with a negative-working layer of the following composition:

2.5% by weight of a copolymer of methacrylic acid/methyl methacrylate/glycerol mono-methacrylate (20/30/50) having a mean molecular weight $M_w$ of 24,000 (GPC), 0.5% by weight of a diazonium salt polycondensation product of 1 mol of 4-anilino-2-methoxybenzenediazonium sulfate and 1 mol of 4,4'-bismethoxymethyl diphenyl ether, precipitated as mesitylene sulfonate, 0.09% by weight of Victoria pure blue FGA (Basic Blue 81), 0.07% by weight of benzenephosphonic acid, 0.1% by weight of a silica-gel filler having a mean particle size of 3 μm, and to make 100% by weight a solvent mixture composed of tetrahydrofuran and ethylene glycol mono-methyl ether (40/60).

The coated base was dried in a drying channel at 120° C. The dry layer weight was 1.4 g/$m^2$. The reproduction layer was exposed for 35 s under a negative master using a 5 kW metal-halide lamp and developed at 1.4 m/min using the following solution at 23° C. in a development machine having a rubbing-out element:

5% by weight of sodium lauryl sulfate,

2% by weight of phenoxyethanol,

1% by weight of sodium metasilicate pentahydrate and

92% by weight of water.

The occurrence of residual layer haze after a loading of the developer with 4 $m^2$ per liter is investigated.

Here, again, the hydrophilization E of the base according to the invention proved more advantageous.

EXAMPLE 4

A base of type 3 was hydrophilized in accordance with Table 1 and coated with the following solution:

3.1% by weight of 2,5-bis(4-diethylaminophenyl)-1,3,4-oxadiazole, 3.1% by weight of a copolymer of styrene and maleic anhydride having a softening point of 210° C., 0.02% by weight of Rhodamine® FB (C.I. 45 170), to make 100% by weight ethylene glycol monomethyl ether. and then dried in a continuous drying oven at 120° C. The layer was negatively charged to 450 V in the dark using a corona. The charged plate was imagewise exposed in a reproduction camera and then developed using an electro-photographic suspension developer composed of a dispersion of 0.6% by weight of magnesium sulfate and a solution of 1.4% by weight of pentaerythritol resin ester in 98% by weight of an isoparaffin mixture having a boiling range of 185° to 210° C. After removal of the excess developer liquid, the toner was fixed and the plate was stripped at 24° C. in a solution composed of 10% by weight of ethanolamine, 10% by weight of propylene glycol monophenyl ether, 2% by weight of $K_2HPO_4$, to make 100% by weight water at a processing speed of 1.4 m/min. The plate was then rinsed off using a powerful water jet in order to remove stripper residues. The occurrence of a residual layer haze after a loading of the stripper with 10 $m^2$ per liter of stripper with an image component of 25% was then investigated.

EXAMPLE 5

A base of type 1 was hydrophilized in accordance with Table 1 and a solution of the following composition was spun on in such a way that a coating weight of 2.5 g/$m^2$ was obtained in each case:

10.7% by weight of the terpolymer solution specified in Example 3, 5.3% by weight of triethylene glycol dimethacrylate, 0.15% by weight of Orasol blue (C.I. 50 315), 0.15% by weight of eosin, alcohol-soluble (C.I. 46 386), 0.11% by weight of 2,4-bistrichloromethyl-6-(4-styrylphenyl)-s-triazine, 0.23% by weight of dicyclopentadienyltitanium-bispentafluorophenyl 42% by weight of butanone and to make 100% by weight butyl acetate.

The plates were then coated after drying with a polyvinyl alcohol layer, exposed and developed.

The recording materials of Examples 1 to 5 were assessed densitometrically (instant-light densitometer, magenta or cyan filter) as follows:

+ no residual layer haze, measured densitometer value<0.01

0 slight residual layer haze, measured densitometer value 0.01–0.02

– residual layer haze present, measured densitometer value >0.02

TABLE 2

| | Assessment of the examples | | | | |
|---|---|---|---|---|---|
| Hydrophilization | 1 | 2 | 3 | 4 | 5 |
| A* | — | — | — | — | — |
| B* | 0 | 0 | 0 | 0 | 0 |
| C* | 0 | 0 | 0 | 0 | 0 |
| D* | 0 | 0 | 0 | 0 | 0 |
| E | + | + | + | + | + |

Examples and Comparison Examples

Examples 6 to 34 (Tables 6 and 7) are intended to show the superiority of the base according to the invention with respect to the bases of Comparison Examples V1 to V52 (Tables 3–5) hydrophilized in accordance with Table 1, A to D. The recording materials, produced according to the conditions specified in the tables, were investigated as follows:

1. Measurement of the color haze:

The reflectance of the non-image areas was measured in the visible light range both in the case of a sample of the uncoated base and in the non-image areas after coating, exposure and development. The twin-channel simultaneous spectrometer MCS512 from Datacolor was used for this purpose. Using the measurement results, the lightness L* of the base surface was calculated in accordance with CIE (Commission International de l'Eclairage, publication No. 15) which is expressly incorporated by reference in its entirety. Details of these calculations are described in DIN Standards 6174 (1979) and 5033 (1970) which is expressly incorporated by reference in its entirety.

In the present case, the illuminant D65 was used and in the calculations, as a departure from the CIE recommendation, a 2° observer was assumed. This lightness of the uncoated base material is specified in column 6 of the following tables. In practice, these calculations automatically also produce the hue parameters a* and b*, but these run parallel to the values of the lightness parameter L* in the investigations on printing-plate bases relevant here and are therefore not taken into account. After these calculations the difference in the lightness before coating and in that of the non-image areas after coating, exposure and development was calculated. Since the photosensitive layers are in practice dark colored (compared with the light-gray base surface) undesirable layer residues would be noticeable as a dark haze in the non-image areas. The lightness of the non-image areas after coating, exposure and development would be less than that before coating. The difference formation resulted in a positive dL* which would be the greater, the more pronounced the undesirable color haze is. This value is specified in column 7 of Tables 3–5.

Color hazes are visible from a measured value of approximately 0.8 and upwards, depending on the practical experience of the observer and his eye response. In any case, they are a cosmetic fault in the printing plate and may result in complaints from the purchasers for that reason alone. If the color haze becomes very pronounced, that is a sign of a very large amount of layer residues in the non-image areas, which may result under certain circumstances in undesirable concomitant printing (scumming), particularly if, as is frequently desired, little damping agent is dispensed. An exact value of the color haze cannot be specified for this case.

2. Measurement of the correction contrast:

The non-image area of a printing plate was treated with a commercial correcting fluid. The lightnesses were then measured, once in the corrected region and once in the uncorrected region. Here, again, the difference dL* was formed. If it is substantially different from 0, i.e. in the range of from 0.5 to 1.0, correction fluid has still either been able to strip layer residues from the surface or, alternatively, it has even attacked and damaged the surface of the non-image area itself.

3. Determination of the hydrophilicity:

The non-image area of a printing plate was coated with printing ink using a rubber hand roller and placed in water, and the time was measured which the water required to strip the ink from the non-image area. In the case of a satisfactorily hydrophilic base, this time must not be more than 30 s.

Comparison Examples V1 to V52

Bases of types 1 and 2 were anodized and treated for 5 s in an immersion bath containing an aqueous solution of a polyvinylphosphonic acid. The conditions for V1 to V12 are specified in Table 3. After the treatment with polyvinylphosphonic acid, the plates were coated with the solution specified in Example 1, exposed and developed with a developer of types 1 or 2 in the development apparatus VA86 mentioned.

TABLE 3

| No. | Base Type | Developer Type | Temperature °C. | Concentration g/l | Lightness L* | Color haze dL*1 | Correction contrast dL*2 | Hydrophilicity s |
|---|---|---|---|---|---|---|---|---|
| V 1 | 1 | 1 | 40 | 2.0 | 77.83 | 1.13 | 1.49 | |
| V 2 | 1 | 1 | 50 | 2.0 | 77.87 | 0.70 | 1.43 | |
| V 3 | 1 | 1 | 60 | 2.0 | 77.28 | 0.16 | 1.08 | |
| V 4 | 1 | 1 | 40 | 5.0 | 77.95 | 2.15 | 2.01 | |
| V 5 | 1 | 1 | 50 | 5.0 | 77.87 | 1.36 | 1.49 | |
| V 6 | 1 | 1 | 60 | 5.0 | 77.87 | 1.04 | 1.54 | |
| V 7 | 1 | 2 | 40 | 5.0 | 77.84 | 2.14 | 1.94 | 15 |
| V 8 | 1 | 2 | 50 | 5.0 | 78.00 | 1.96 | 2.01 | 15 |
| V 9 | 1 | 2 | 60 | 5.0 | 77.49 | 0.81 | 1.51 | 5 |
| V 10 | 2 | 1 | 40 | 5.0 | 79.10 | 3.46 | 2.81 | 15 |
| V 11 | 2 | 1 | 50 | 5.0 | 79.02 | 2.21 | 1.91 | 15 |
| V 12 | 2 | 1 | 60 | 5.0 | 78.94 | 2.30 | 2.22 | 5 |

Table 3 shows that, although the printing plates not produced in accordance with the invention have sufficiently good hydrophilicity (insofar as it was determined) in the non-image areas, they either have a marked color haze or suffer attack by the correcting fluid, which results in a coloration in the non-image areas, or both phenomena. Although two different base types were used and two different developers were used, none of the combinations specified in the table are capable of exhibiting good results in all characteristics.

The recording materials of Table 4 were produced with a base of type 2 and treated with a phosphono methylated polyimine in accordance with EP-A 0 490 231, hereby incorporated by reference. Said polymer had a molar mass $M_w$ of about 80,000.

TABLE 4

| No. | Temperature °C. | Concentration g/l | Lightness L* | Color haze dL*1 | Correction contrast dL*2 | Hydrophilicity s |
|---|---|---|---|---|---|---|
| V 13 | 22 | 2.0 | 78.93 | 2.08 | 1.75 | 5 |
| V 14 | 30 | 2.0 | 78.94 | 0.96 | 1.28 | 15 |
| V 15 | 40 | 2.0 | 78.95 | 0.86 | 1.13 | 5 |
| V 16 | 50 | 2.0 | 79.02 | 0.53 | 0.80 | 5 |
| V 17 | 60 | 2.0 | 79.00 | 0.41 | 0.76 | 5 |
| V 18 | 22 | 1.0 | 78.97 | 2.31 | 1.88 | 5 |
| V 19 | 30 | 1.0 | 79.01 | 0.67 | 0.96 | 5 |
| V 20 | 40 | 1.0 | 78.44 | 0.57 | 1.08 | 5 |
| V 21 | 30 | 1.0 | 79.00 | 0.51 | 0.62 | 15 |
| V 22 | 60 | 1.0 | 78.96 | 0.25 | 0.57 | 15 |
| V 23 | 22 | 0.5 | 79.05 | 2.08 | 0.98 | 5 |
| V 24 | 30 | 0.5 | 79.02 | 1.20 | 0.95 | 5 |
| V 25 | 40 | 0.5 | 79.00 | 1.09 | 0.36 | 5 |
| V 26 | 50 | 0.5 | 78.96 | 0.12 | 0.46 | 5 |
| V 27 | 60 | 0.5 | 78.93 | 0.12 | 1.40 | 5 |
| V 28 | 22 | 0.2 | 78.98 | 2.67 | 1.89 | 5 |
| V 29 | 30 | 0.2 | 79.05 | 2.53 | 1.74 | 5 |
| V 30 | 40 | 0.2 | 78.97 | 2.88 | 1.83 | 15 |
| V 31 | 50 | 0.2 | 79.01 | 2.53 | 1.66 | 5 |
| V 32 | 60 | 0.2 | 78.92 | 2.58 | 1.35 | 5 |

In the case of the printing plates of V13 to V32, which all exhibit a good hydrophilicity in the non-image areas, the measured values for the color haze and/or the correction contrast are unsatisfactory. Although V26 exhibits good values, it does not fit into the pattern of the other samples and must therefore be assessed as an aberation. This type of base treatment cannot be carried out in a statistically controlled manner and is unsuitable for a reliable production process.

The same applies to the comparison examples in Table 5. Here, bases of type 2 were consecutively treated first with a solution of polyvinylphosphonic acid in water and, after a rinsing step, with a solution of the above-mentioned phosphonomethylated polyamine. The immersion time in both baths was 5 s. The concentration specified in Table 5 is the concentration of the polyvinyl phosphonic acid and the concentration 2 is that of the phosphonomethylated polyimine.

Here, again, the values of the color haze and those of the correction contrast are generally too high. Although a few good results (V34, V36 and V38) are shown, and a tendency to improve is to be observed in some pairs at higher temperatures, this cannot always be relied upon. This type of base treatment is therefore unsuitable for conducting a production process in a reliable manner.

TABLE 5

| No. | Temperature °C. | Concentration 1 g/l | Concentration 2 g/l | Lightness L* | Color haze dL*1 | Correction contrast dL*2 | Hydrophilicity s |
|---|---|---|---|---|---|---|---|
| V 33 | 40 | 2.2 | 2.0 | 78.94 | 0.62 | 0.98 | 15 |
| V 34 | 60 | 2.2 | 2.0 | 78.98 | −0.08 | 1.46 | 5 |
| V 35 | 40 | 2.2 | 1.0 | 79.20 | 0.83 | 1.00 | 5 |
| V 36 | 60 | 2.2 | 1.0 | 79.07 | −0.03 | 1.45 | 5 |
| V 37 | 40 | 2.2 | 0.5 | 79.10 | 1.28 | 1.44 | 5 |
| V 38 | 60 | 2.2 | 0.5 | 79.09 | 0.01 | 0.52 | 5 |
| V 39 | 40 | 2.2 | 0.2 | 79.19 | 2.15 | 2.15 | 5 |
| V 40 | 60 | 2.2 | 0.2 | 78.97 | 0.66 | 1.17 | 5 |
| V 41 | 40 | 2.2 | 0.1 | 79.17 | 2.19 | 2.19 | 5 |
| V 42 | 60 | 2.2 | 0.1 | 78.63 | 1.56 | 1.84 | 5 |
| V 43 | 40 | 1.0 | 10.0 | 78.83 | 0.25 | 1.14 | 15 |
| V 44 | 60 | 1.0 | 10.0 | 78.93 | 0.23 | 0.93 | 15 |
| V 45 | 40 | 0.5 | 5.0 | 78.98 | 3.07 | 2.59 | 5 |
| V 46 | 60 | 0.5 | 5.0 | 78.97 | 2.41 | 2.67 | 5 |

TABLE 5-continued

| No. | Temperature °C. | Concentration 1 g/l | Concentration 2 g/l | Lightness L* | Color haze dL*1 | Correction contrast dL*2 | Hydrophilicity s |
|---|---|---|---|---|---|---|---|
| V 47 | 40 | 0.2 | 0.5 | 79.08 | 2.00 | 1.28 | 5 |
| V 48 | 60 | 0.2 | 0.5 | 79.02 | 1.36 | 0.53 | 5 |
| V 49 | 40 | 0.1 | 0.2 | 78.99 | 1.94 | 1.19 | 5 |
| V 50 | 60 | 0.1 | 0.2 | 79.07 | 2.65 | 1.53 | 15 |
| V 51 | 40 | 0.1 | 0.1 | 79.16 | 3.17 | 2.91 | 5 |
| V 52 | 60 | 0.1 | 0.1 | 79.11 | 3.03 | 2.47 | 5 |

EXAMPLES 6 TO 34

Bases of type 2 in Table 6 and of type 4 in Table 7 were first immersed in an aqueous solution of the phosphonomethylated polyimine and then, after a rinsing step, in an aqueous solution of polyvinylphosphonic acid for 5 s. Immersion times of up to a few minutes have the same effect. However, a minimum immersion time of 1 s per bath must be maintained.

TABLE 6

| No. | Temperature °C. | Concentration 1 g/l | Concentration 2 g/l | Lightness L* | Color haze dL*1 | Correction contrast dL*2 | Hydrophilicity s |
|---|---|---|---|---|---|---|---|
| 6 | 40 | 3.94 | 4.00 | 77.85 | −0.35 | 0.05 | 15 |
| 7 | 50 | 3.94 | 4.00 | 77.51 | −0.74 | 0.00 | 5 |
| 8 | 60 | 3.94 | 4.00 | 77.53 | −0.61 | 0.07 | 5 |
| 9 | 40 | 2.63 | 2.00 | 77.54 | −0.13 | 0.33 | 5 |
| 10 | 50 | 2.63 | 2.00 | 77.62 | −0.44 | 0.23 | 5 |
| 11 | 60 | 2.63 | 2.00 | 77.56 | −0.66 | 0.00 | 5 |
| 12 | 40 | 1.32 | 1.00 | 77.65 | −0.02 | 0.47 | 5 |
| 13 | 50 | 1.32 | 1.00 | 77.72 | 0.09 | 0.41 | 5 |
| 14 | 60 | 1.32 | 1.00 | 77.62 | −0.48 | 0.11 | 5 |
| 15 | 40 | 0.53 | 0.25 | 77.87 | 0.26 | 0.56 | 5 |
| 16 | 50 | 0.53 | 0.25 | 77.88 | −0.04 | 0.27 | 5 |
| 17 | 60 | 0.53 | 0.25 | 77.85 | −0.12 | 0.21 | 5 |
| 18 | 40 | 0.20 | 4.00 | 77.62 | 0.10 | 0.69 | 15 |
| 19 | 50 | 0.20 | 4.00 | 77.83 | 0.33 | 0.82 | 15 |
| 20 | 60 | 0.20 | 4.00 | 77.85 | −0.09 | 0.60 | 15 |

TABLE 7

| No. | Temperature °C. | Concentration 1 g/l | Concentration 2 g/l | Lightness L* | Color haze dL*1 | Correction contrast dL*2 | Hydrophilicity s |
|---|---|---|---|---|---|---|---|
| 21 | 40 | 0.50 | 4.00 | 79.05 | 0.99 | 0.71 | 5 |
| 22 | 50 | 0.50 | 4.00 | 79.10 | 0.60 | 0.31 | 5 |
| 23 | 60 | 0.50 | 4.00 | 79.04 | 0.40 | 0.30 | 5 |
| 24 | 40 | 0.50 | 2.00 | 79.11 | 0.55 | 0.34 | 5 |
| 25 | 50 | 0.50 | 2.00 | 79.09 | 0.38 | 0.14 | 5 |
| 26 | 60 | 0.50 | 2.00 | 79.15 | 0.31 | 0.08 | 5 |
| 27 | 40 | 1.00 | 2.20 | 79.28 | 0.22 | 0.55 | 5 |
| 28 | 50 | 1.00 | 2.20 | 79.31 | 0.29 | 0.53 | 5 |
| 29 | 60 | 1.00 | 2.20 | 79.29 | 0.25 | 0.50 | 5 |
| 30 | 40 | 0.50 | 2.20 | 79.40 | 0.45 | 0.44 | 5 |
| 31 | 50 | 0.50 | 2.20 | 79.41 | 0.33 | 0.34 | 5 |
| 32 | 60 | 0.50 | 2.20 | 79.39 | 0.18 | 0.40 | 5 |
| 33 | 50 | 0.20 | 2.20 | 79.32 | 0.72 | 0.74 | 5 |
| 34 | 60 | 0.20 | 2.20 | 79.36 | 0.81 | 0.72 | 5 |

It is seen that good values for color haze and correction contrasts are achieved in all cases. Negative numerical values mean that, during the development process, not only the photosensitive layer was removed, but the surface of the base was also cleaned in addition, which is to be regarded as favorable. The hydrophilicity is also as good as in the other cases.

Other embodiments of the invention will become apparent to those skilled in the art from consideration of the specification and practice of the invention disclosed herein. It is intended that the specification be considered as exemplary only, with the true scope and spirit of the invention being indicated by the following claims.

What is claimed is:

1. A base material comprising:

a substrate comprising aluminum or an aluminum alloy, which is grained by at least one of mechanical and electrochemical graining;

a first hydrophilic layer adjacent to said substrate, the first hydrophilic layer comprising at least one polymer containing basic and acidic groups; and a further hydrophilic layer on the first hydrophilic layer comprising at least one compound which contains at least one phosphono group.

2. A base material as claimed in claim 1, wherein the basic groups in the polymer containing basic and acidic groups comprise one or more of primary, secondary and tertiary amino groups, and the acidic groups comprise one or more of carboxy, phosphono or sulfo groups.

3. A base material as claimed in claim 1, wherein the polymer containing basic and acidic groups has a pH in the range of 4 to 9.

4. A base material as claimed in claim 3, wherein the pH is in the range of 4.5 to 7.5.

5. A base material as claimed in claim 1, wherein the compound containing at least one phosphono group is a polymer.

6. A method of producing the base material as claimed in claim 1, comprising:

applying the first hydrophilic layer to said grained and optionally anodized base material; and applying the further hydrophilic layer on top the first hydrophilic layer.

7. A method as claimed in claim 6, wherein said first hydrophilic layer is applied by at least one of spraying a first aqueous solution containing the at least one polymer onto the substrate and immersion of the substrate into the first aqueous solution, and the further hydrophilic layer is applied by at least one of spraying a second aqueous solution containing at least one compound onto the substrate and immersion of said substrate into the second aqueous solution.

8. A method as claimed in claim 7, wherein the first aqueous solution and the second aqueous solution both independently have a concentration from 0.1 to 50 g/l.

9. A method as claimed in claim 8, wherein the concentration of the first and second aqueous solutions is independently from 0.3 to 5 g/l.

10. A method as claimed in claim 6, wherein the first and further hydrophilic layers are applied at temperatures from 20° to 95° C.

11. A method as claimed in claim 10 wherein, the temperatures are independently from 30° to 65° C.

12. A method as claimed in claim 6, further comprising drying the base material at a temperature from 100° to 130° C. after the application of said first and further hydrophilic layers.

13. A recording material comprising the hydrophilized base material as claimed in claim 1, and a radiation-sensitive layer.

14. A base material comprising:

a substrate comprising aluminum or an aluminum alloy, which is grained by at least one of mechanical and electrochemical graining and is further anodized;

a first hydrophilic layer adjacent to said substrate, the first hydrophilic layer comprising at least one polymer containing basic and acidic groups; and a further hydrophilic layer on the first hydrophilic layer comprising at least one compound which contains at least one phosphono group.

15. A base material as claimed in claim 14, wherein the basic groups in the polymer containing basic and acidic groups comprise one or more of primary, secondary and tertiary amino groups, and the acidic groups comprise one or more of carboxy, phosphono or sulfo groups.

16. A base material as claimed in claim 14, wherein the polymer containing basic and acidic groups has a pH in the range of 4 to 9.

17. A base material as claimed in claim 16, wherein the pH is in the range of 4.5 to 7.5.

18. A base material as claimed in claim 14, wherein the compound containing at least one phosphono group is a polymer.

19. A method of producing the base material as claimed in claim 14, comprising:

applying the first hydrophilic layer to said grained and optionally anodized base material; and applying the further hydrophilic layer on top the first hydrophilic layer.

20. A method as claimed in claim 19, wherein said first hydrophilic layer is applied by at least one of spraying a first aqueous solution containing the at least one polymer onto the substrate and immersion of the substrate into the first aqueous solution, and the further hydrophilic layer is applied by at least one of spraying a second aqueous solution containing at least one compound onto the substrate and immersion of said substrate into the second aqueous solution.

21. A method as claimed in claim 20, wherein the first aqueous solution and the second aqueous solution both independently have a concentration from 0.1 to 50 g/l.

22. A method as claimed in claim 21, wherein the concentration of the first and second aqueous solutions is independently from 0.3 to 5 g/l.

23. A method as claimed in claim 19, wherein the first and further hydrophilic layers are applied at temperatures from 20° to 95° C.

24. A method as claimed in claim 23, wherein the temperatures are independently from 30° to 65° C.

25. A method as claimed in claim 19, further comprising drying the base material at a temperature from 100° to 130° C. after the application of said first and further hydrophilic layers.

26. A recording material comprising the hydrophilized base material as claimed in claim 14, and a radiation-sensitive layer.

* * * * *

UNITED STATES PATENT AND TRADEMARK OFFICE

CERTIFICATE OF CORRECTION

PATENT NO. : 5,637,441
DATED : June 10, 1997
INVENTOR(S) : Brenk et al.

It is certified that error appears in the above-identified patent and that said Letters Patent is hereby corrected as shown below:

Column 15, Line 30, Claim 6 delete "and optionally anodized"

Column 16, Line 28, Claim 19 delete "optionally"

Signed and Sealed this

Second Day of June, 1998

Attest:

BRUCE LEHMAN

*Attesting Officer* *Commissioner of Patents and Trademarks*